June 25, 1963 R. L. FUSFIELD ETAL 3,095,542

ACTIVE FREQUENCY SELECTIVE FILTER SYSTEM

Filed April 28, 1960 2 Sheets-Sheet 1

INVENTORS.
ROBERT L. FUSFIELD,
PAUL E. STERBA JR.,
BY
Walter J. Adam
ATTORNEY.

ACTIVE FREQUENCY SELECTIVE FILTER SYSTEM

Filed April 28, 1960 2 Sheets-Sheet 2

INVENTORS.
ROBERT L. FUSFIELD,
PAUL E. STERBA, JR.,
BY
Walter J. Adam
ATTORNEY

United States Patent Office 3,095,542

Patented June 25, 1963

3,095,542
ACTIVE FREQUENCY SELECTIVE FILTER SYSTEM

Robert L. Fusfield and Paul E. Sterba, Jr., Los Angeles, Calif., assignors to Hughes Aircraft Company, Culver City, Calif., a corporation of Delaware Filed Apr. 28, 1960, Ser. No. 25,309
6 Claims. (Cl. 330—71)

This invention relates to variable frequency active filters and particularly to a frequency selective filter that provides a narrow pass band over a wide range of selected frequencies.

Frequency selective filters are highly useful, for example, in testing electronic systems to provide accurate readings of test results. A signal passed through a system to be tested conventionally is accompanied by noise signals and other undesired signal components appearing as sidebands to the signal. Before applying the signal to a display device, it is desirable to pass the signal through a narrow band pass filter to eliminate all components except the fundamental desired signal so as to obtain an accurate and reliable reading or indication.

Particular prior art frequency selective filters utilize a twin-T network and a mechanical coupling or ganging arrangement to simultaneously vary either three resistors or three capacitors. This control of tuning by ganging three elements has the disadvantage in that the variation of the three elements must be reliable, that is, the three elements must accurately track each other, which requires complicated mechanical devices. Further, prior art frequency selective filters have been found to have a limited range of frequency selection. A frequency selective filter that provides frequency selection over a wide frequency range and that has a simplified and reliable means of control would be very advantageous to the art.

An object of this invention is, therefore, to provide a simplified frequency selective filter circuit in which a frequency pass band may be selected by variation of the setting of a single potentiometer or voltage divider means.

It is a further object of this invention to provide a frequency selective circuit that develops an extremely wide operating range by controlling a range switch.

It is a still further object of this invention to provide an improved frequency rejection circuit that results in reliable frequency rejection over a wide range of frequency change by varying a switch and a single variable element.

Briefly, in accordance with this invention, a frequency selective filter system provides simplified control means for selecting a narrow frequency pass band over a wide range of frequencies. A frequency selective amplifier responds to input signals which are passed through a cathode follower arrangement to an output terminal. A frequency rejection circuit is provided as a negative feedback element between the output terminal and the amplifier for controlling the gain of the amplifier to attenuate signals at all frequencies except the selected frequency. The frequency rejection circuit includes a potentiometer, a cathode follower, a bidirectional range switch and a pair of transmission paths in a parallel T or twin-T network including a first T network having low pass characteristics and a second T network having high pass characteristics. The first and second T networks have their output joined at a summing point so as to each contribute to the total feedback signal. The T networks have relative phase characteristics that differ by substantially 180° independent of frequency, and the relative amplitudes of signals applied through the two T networks vary differently with frequency except at a selected frequency where they are equal in amplitude so as to substantially cancel. The signal at the output terminal is instantaneously applied both through a potentiometer and a cathode follower and directly to the range switch which selectively passes the attenuated and the direct signal either respectively through the first and second T networks or through the second and first T networks. The range switch selects either a first or a second adjoining frequency range for rejection and the potentiometer selects a rejection frequency within either range. The attenuated signal components representative of the rejection frequency are applied from the summing point to the amplifier to vary the gain characteristics so that the signal components at the rejection frequency of the frequency rejection circuit are in the center of the pass band. Thus, the system operates as a narrow band pass filter having a pass band with steep sides to pass a signal to the output at the selected rejection frequency.

The novel features of this invention, as well as the invention itself, both as to its organizaiton and method of operation, will best be understood from the following description taken in conjunction with the accompanying drawings, in which.

Figure 1:
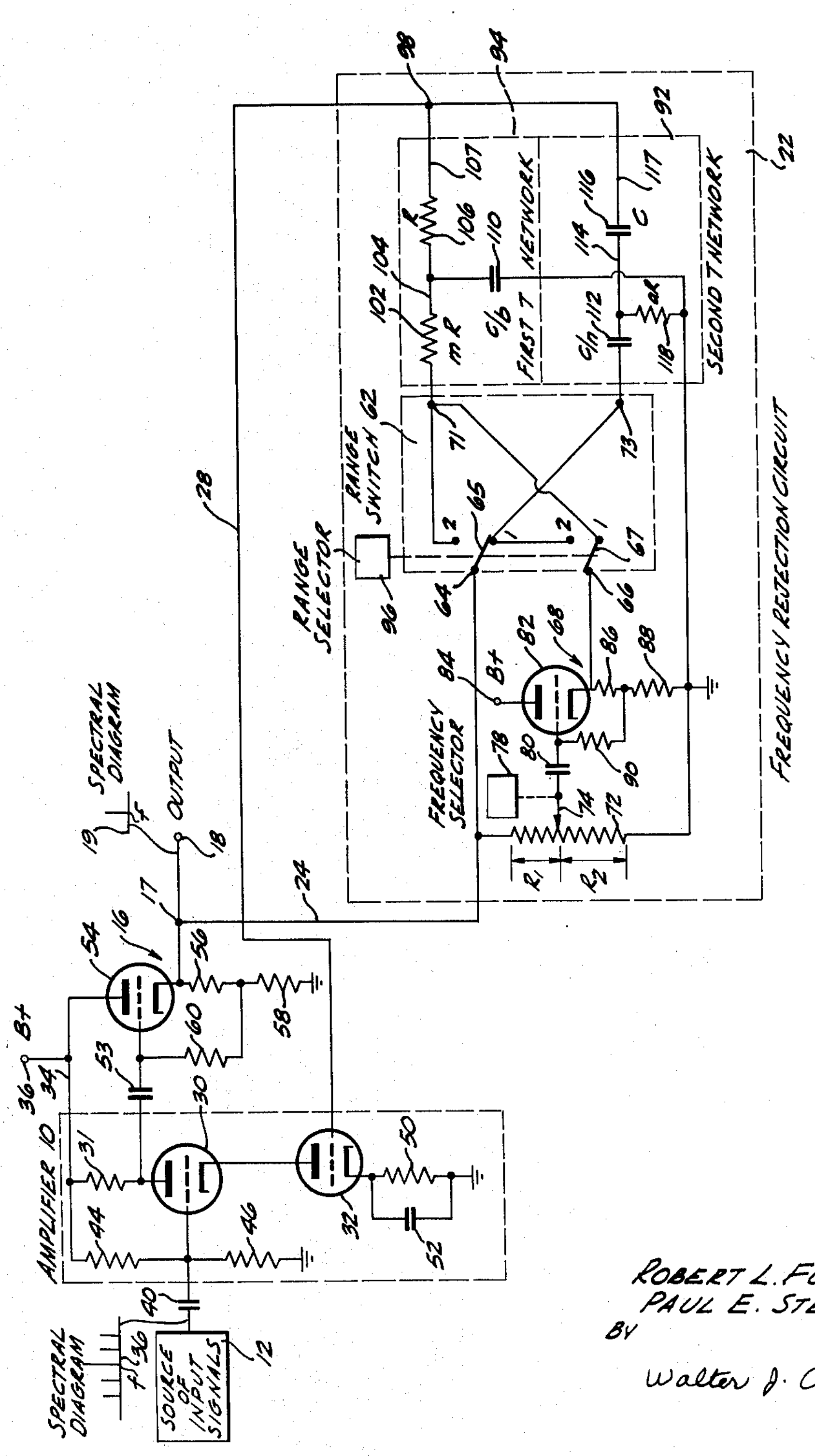
FIG. 1 is a schematic circuit diagram of the frequency selective filter system in accordance with this invention.

Referring to FIG. 1, which is a schematic circuit diagram of the frequency selective filter system in accordance with this invention, the arrangement of the elements therein will be first explained. The system includes a frequency selective amplifier 10 responding to a source of input signals 12 to apply an output signal through a cathode follower 16 to an output lead 17 and to an output terminal 18. To provide a feedback control operation, a frequency rejection circuit 22 is provided coupled to the output terminal 18 by a lead 24 and coupled to the amplifier 10 by a lead 28. The amplifier 10 includes a first triode 30 with its cathode coupled to the anode of a second triode 32 so as to provide a cascade arrangement. The anode of the triode 30 is supplied operating potential through a resistor 31 and a lead 34 from a source of positive B+ potential 36. The grid of the tube 30 responds to a signal having a plurality of frequency components as shown by a spectral diagram 36 applied from the source of input signals 12 through a coupling capacitor 40 to the grid of the tube 30. A D.C. (direct current) bias potential is applied to the grid of the tube 30 through a voltage divider path from the lead 34 through a resistor 44 coupled to the grid and in turn coupled through a resistor 46 to ground. The tube 32 has a cathode coupled to ground through a resistor 50 and a parallel filter capacitor 52. The tube 32 is responsive at its grid to the feedback signal of the lead 28 so as to control the gain of the tube 30 by controlling the impedance at the cathode of the tube 30 by cathode degeneration.

The frequency components of the input signal after responding to the gain of the tube 30 are applied from the anode of the tube 30 through a coupling capacitor 53 to the grid of a cathode follower tube 54 of the cathode follower circuit 16 to provide a high output impedance to the amplifier 10 so as to maintain the signal gain and to provide a low input impedance to the frequency rejection circuit 22. The anode of the cathode follower tube 54 is coupled to the source of potential 36 and the cathode is coupled to ground through series coupled resistors 56 and 58. To provide a bias potential to the grid of the tube 54, a point between the resistors 56 and 58 is coupled through a resistor 60 to the grid of the tube 54.

Frequency rejection circuit 22, which provides the feedback control for the frequency selective amplifier 10, includes a range switch 62 having a first input terminal 64 coupled directly to the lead 24 and a second input terminal 66 coupled to the cathode of a cathode follower circuit 68 to provide a signal attenuating path from a resistor 72. The lead 24 instantaneously applies the output signal from the lead 17 to one end of the resistor 72, the other end being coupled to ground. A movable arm 74 is controllable to move along the resistor 72 in response to a frequency selector control 78, thus varying the loss or attenuation of the signal applied thereto. The resistor 72 and the arm 74 may be a conventional potentiometer. The signal received by the arm 74 is applied through a coupling capacitor 80 to the grid of a cathode follower tube 82 of the cathode follower circuit 68 which tube provides a low input impedance to the terminal 66 consistent with the low input impedance to the terminal 64 from the cathode follower circuit 16. The tube 82 has its anode coupled to a source 84 of positive potential B+ and its cathode coupled to ground through series connected resistors 86 and 88. To provide a grid bias the grid of the tube 82 is coupled through a resistor 90 to a point between the resistors 86 and 88. Thus, the signal derived from the output lead 17 is applied directly to the terminal 64 and applied after a selected attenuation to the terminal 66 of the range switch 62.

The range switch 62 which may be a double pole double throw switch applies the signal in position 1, as shown directly from the terminal 64 through a switch arm 65 to a terminal 73 and through a second T network 92, and applies the signal after attenuation from the terminal 66 through a switch arm 67 to a terminal 71 and to a first T-network 94. In position 2, the range switch 62 couples the signal directly from the terminal 64, to the terminal 71 and to the first T network 94 and couples the attenuated signal from the lead 66 to a terminal 73 and through the second T network 92. A range selector control 96 controls the switch arms 65 and 67 to simultaneously be in positions 1 or 2 for providing two ranges of operation to the system, as will be explained in further detail subsequently.

The first and second T networks 94 and 92, which together are a twin-T or parallel-T circuit, provide two transmission paths for the signals applied thereto with the output combined at a summing point 98. The first T network 94 is a conventional low pass T-filter and the second T network 92 is a conventional high pass T-filter. The first T network 94 includes a resistor 102 coupled from the switch terminal 71 to a lead 104 which in turn is coupled through a resistor 106 and through a lead 107 to the summing point 98. The lead 104 is coupled to ground through a capacitor 110. The second T network 92 includes a capacitor 112 coupled between the switch terminal 73 to a lead 114 which in turn is coupled through a capacitor 116 to a lead 117 and to the summing point 98. The lead 114 is coupled to ground through a resistor 118. The relative phase characteristics of signals applied through the T networks 94 and 92 are such that the phase differs by substantially 180°, that is the voltage signal developed at the output lead 107 of the T network 94 lags the signal developed at the output lead 117 of the T network 92 by 180°. This phase relation is substantially independent of frequency of the signals applied thereto. The signals on the leads 107 and 117 developed by the T networks 94 and 92 vary differently in amplitude with frequency being equal in amplitude only at a selected frequency, thus providing the greatest attenuation for the selected frequency at the summing point 98. The attenuation signal which may include frequency components over a wide range of frequency is applied from the summing point 98 through the lead 28 to the grid of the tube 32 to increase the gain of the frequency selective amplifier 10 at the selected frequency pass band.

Figure 2:
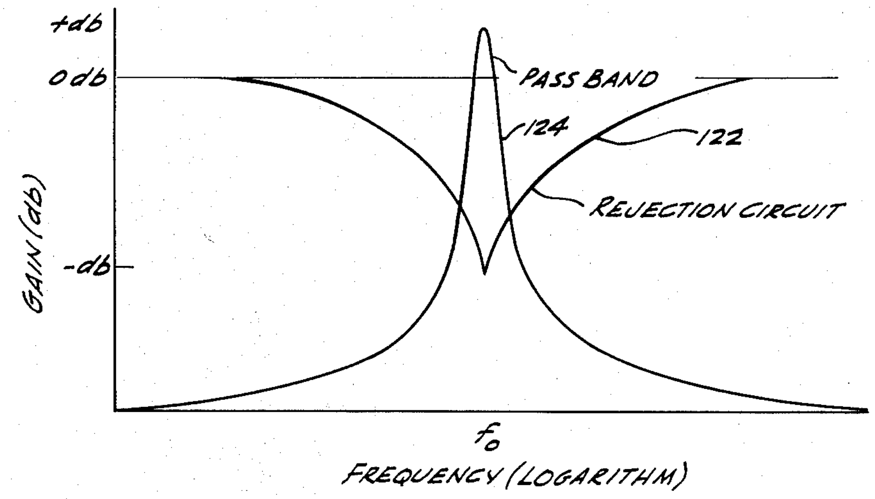
FIG. 2 is a graph of the logarithm of frequency versus gain in decibels for explaining the operation of the rejection circuit and the pass band of the filter system of FIG. 1.

Referring now to FIG. 1 and to FIG. 2 which is a graph of the logarithm of frequency versus gain in decibels, the operation of the system will be explained in further detail. The frequency selective amplifier 10 responds to all of the frequency components of the input signal as shown by the diagram 36 to apply signals to the cathode follower 16 and to the output terminal 18 as determined by the instantaneous negative feedback action of the frequency rejection circuit 22 which provides a variable cathode resistance to the tube 30. The signal on the output lead 17 is instantaneously applied to the frequency rejection circuit 22 to develop the negative feedback signal and made up of a plurality of frequency components attenuated as indicated by a rejection curve 122 of FIG. 2 symmetrical around a system center frequency $f_0$. The signal components attenuated as shown by the curve 122 are instantaneously applied to the grid of the tube 32 so that the gain of the tube 30 is substantially increased for signal components in a narrow frequency band around the selected frequency which in FIG. 2 is the center frequency $f_0$, and is decreased for signal components at other frequencies. The frequency rejection circuit 22 provides sharp null point as shown by the curve 122 so as to discriminate between signals in a narrow frequency range. The result of the negative feedback action is a frequency pass band through the system indicated by a curve 124 that attenuates all frequency components below 0 decibels (db) gain, for example, at all frequencies except a narrow frequency range about the selected frequency. Thus, an input signal of the spectral diagram 36 passes only the selected signal components of the diagram 19 when the frequency $f$ is selected.

To explain the operation of the frequency rejection circuit 22 in an analytical manner, the values of resistor 72 and the components of the T networks 94 and 92, as indicated in FIG. 1, will be now referred to. Making the assumption that the load impedance is very much greater than a resistive value R which is valid because of the high impedance of the grid of the tube 32, and the condition that a low input impedance is provided to both T networks, the following relations were calculated. For the condition when the resistance of the first T network 94 is coupled to the arm 74 either position 1 or 2 with the arm 74 at the lead 24 end of the ressitor 72 so that no attenuation is present, the following equation was derived:

$$(RC\omega)^2 = b\frac{(n+1)}{xm} \qquad \text{(A)}$$

where:

$R$=a selected resistance value
$C$=a selected capacitance value
$\omega$=a selected frequency in radians
$b$=an integer which divided into C represents the value of the capacitor 110.
$n$=an integer which divided into C determines the value of the capacitor 112.

$$x = \frac{R_2}{R_1 + R_2}$$

where:

$R_1$ is the value of the resistor 72 between the arm 72 and the lead 24 and $R_2$ is the value of the resistor 72 between the arm 74 and ground.
$m$=an integer which multiplied by R represents the value of the resistor 102.

Also for the condition when the capacitance of the first T network 94 is coupled through the arm 74 (either position 1 or 2) with the arm at the top of the resistor 72 so that no attenuation is present, the following equation is derived:

$$(RC\omega)^2=\frac{n}{a\chi(m+1)} \qquad (B)$$

where:

$a$=an integer which multiplied by R determines the value of the resistor 102.

Combining these two equations results in the following necessary condition relating the values of the elements of the T networks 94 and 92:

$$mn=ab(m+1)(n+1) \qquad (C)$$

Examining this equation shows that a possible combination of values are that $m=n=b=1$ and $a=1/4$.

From the above condition an equation representative of a selected frequency $\omega$ for position 1 of the range switch 62 with the first T network 94 coupled to the variable arm 74 is:

$$\omega=\sqrt{x\left[\frac{n}{a(m+1)}\right]}\left(\frac{1}{RC}\right) \qquad (D)$$

An equation for position 2 of the range switch 62 with the second T network 92 coupled to the variable arm 74 is:

$$\omega=\sqrt{\frac{1}{x}\left[\frac{n}{a(m+1)}\right]}\left[\frac{1}{RC}\right] \qquad (E)$$

The following expression has been calculated for determining the Q of the system:

$$Q=\frac{ab}{n[b(m+1)+m]} \qquad (F)$$

As shown by Equations D and E with the range switch 62 in position 1 or 2 and as $x$ is varied, the selected radian frequency $\omega$ varies over logarithmic ranges of frequency. With the range switch in position 1, the frequency varies over a logarithmic range of lower frequency than with the range switch in position 2. In position 1 as shown by Equation D, the frequency $\omega$ increases as $x$ increases toward one or as the arm 72 moves toward the lead 24 end of the resistor 72 since $x$ is a fraction of one. In position 2, as shown by Equation E, the frequency $\omega$ increases as $x$ decreases toward zero or as the arm 72 moves toward the ground end of the resistor 72. Thus, Equations D and E show that two ranges of system operation are provided around a system center frequency where $\chi=1$, by the range selector control 96.

Figure 3:
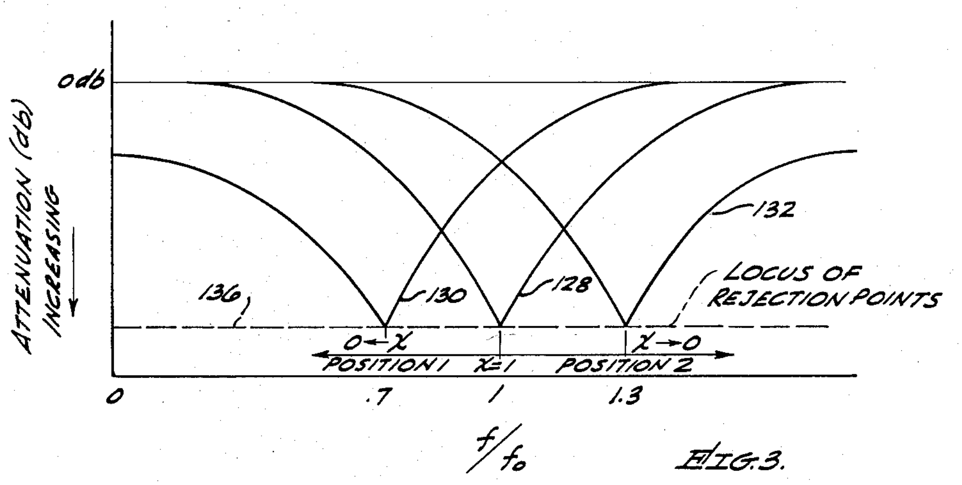
FIG. 3 is a graph of a ratio of selected frequency over the center frequency of the system versus attenuation in decibels for explaining the wide range of operation of the filter system of FIG. 1.

Referring now to FIG. 1 and to FIG. 3 which is a graph of attenuation in decibels versus the ratio of a selected frequency over the center frequency of the system, that is $f/f_0$, the two frequency ranges of operation will be explained. The center frequency $f_0$ is the pass band frequency of the system as determined by the values of the components therein when $x=1$, that is the arm 74 is at the lead 24 end of the resistor 72. A rejection curve 128 resulting from the selected frequency and the system center frequency $f_0$ being equal is shown symmetrically attenuating frequency components in both an increasing and a decreasing direction of the ratio $f/f_0$. The rejection curve 128 represents a selected frequency similar to that of the curve 122 of FIG. 2. For this selected frequency at the rejection point of the curve 128, $x=1$ and the arm 74 is at the top or the lead 24 end of the resistor 74 so that signals applied to the T networks 94 and 92 are not attenuated in either positions 1 or 2 of the range switch 62. In position 1 of the range switch 62, the selected frequency $f$ decreases as $x$ is decreased, that is as the arm 74 is moved along the resistor 72 toward the ground end thereof. A rejection curve 130 representative of a selected frequency $f$ with the range switch 62 in position 1 is shown with an $f/f_0$ ratio equal to .7. In position 2 of the range switch 62, the selected frequency $f$ is increased as $x$ approaches 0, that is the arm 74 is moved from the lead 24 end toward the ground end of the resistor 72. A rejection curve 132 representative of a selected frequency $f$ with the range switch 62 in position 2 is shown with a frequency ratio $f/f_0$ equal to 1.3.

Each of the rejection curves 128, 130 and 132 have a maximum attenuation along a locus line 136 which is constant at any selected frequency in either the frequency range of positions 1 or 2. Thus, the feedback signal applied to the grid of the tube 32 is constant at the selected frequency so that reliable feedback control is obtained over the entire frequency range of system operation. It is to be noted that the rejection curve 130 has a slightly higher attenuation at the low frequency end than at the high frequency end and that the rejection curve 132 has a greater attenuation at the high frequency end than at the low frequency end. This unsymmetrical attenuation is caused in position 1 of the range switch 62 as $x$ approaches 0 or the arm 74 moves toward the ground end of the resistor 72, by the low frequency components through the first T network 94 being attenuated while the high frequency components passed through the second T network 92 are being applied directly thereto without attenuation. Also, in position 2, the low frequency components passed through the second T network 92 are being applied directly thereto without being attenuated and the high frequency components passed through the first T network 94 are being attenuated. Although the rejection curves are not symmetrical except when the selected frequency equals the system center frequency, the attenuator is of sufficient symmetry to provide highly reliable system operation. It is to be noted that when $x$ is very small in either the position 1 or 2 ranges, the system acts respectively as a low or a high pass filter. Signal components attenuated as represented by the rejection curves 128, 130 and 132 are applied to the grid of the tube 32 to vary the cathode impedance and the gain of the tube 30 so that only input signals at a narrow frequency range of a selected frequency $f$ are passed to the output terminal 18 with a high gain. The amplifier 10 acts as a Q multiplier with the sides of the pass band 124 of FIG. 2 being very steep around the selected frequency $f$. For example, with a selected frequency $f$ the input signal of the diagram 36 attenuates all other signals so that substantially only the signal of interest at the frequency $f$ as shown by the waveform 19 is passed to the output terminal 18. The range of operation of the system is such that the ratio $f/f_0$ varies between 0 and $\infty$ but is limited at the upper range by the amount of shunt capacitance in the system.

It is to be noted that the scope of the invention includes other arrangements for the potentiometer 70 on the cathode follower circuit 68. For example, the voltage divider 70 may be a voltage variable resistance controllable by an externally applied signal. Another arrangement is to replace the voltage divider 70 and the cathode follower circuit 68 with a pentode controlled at the suppressor grid with a D.C. (direct current) voltage. Another arrangement which is to be included within the scope of this invention is to replace the range switch 62 with an electronic switch such as a relay for remote control thereof. It is also to be noted that the frequency selective filter system may be utilized as a distortion analyzer by selecting desired frequency components as well as for rejecting undesired signal components. Further, the frequency rejection circuit in accordance with this invention is useful to provide a wide range oscillator circuit.

Thus, there has been described a frequency selective filter system that includes a highly reliable frequency rejection circuit for providing a negative feedback signal to control a frequency selective amplifier. A range switch provides selection of a low and a high frequency range and a frequency selector provides selection of desired frequency in either frequency range. The frequency control in either range of frequency is a single potentiometer or voltage divider means to provide highly reliable operation. The frequency rejection circuit is widely useful wherever frequency rejection over a wide range is desired. The system as an active filter device is highly useful for eliminating undesired frequency components from a test signal to be recorded or displayed on a cathode ray tube.

What is claimed is:

1. A frequency rejection system responsive to an input signal having a plurality of frequency components to pass only a selected frequency component thereof to a system output terminal comprising a frequency selective amplifier responsive to said input signal and having a control terminal, first cathode follower means coupled between said amplifier and the system output terminal, switching means having a first and a second input terminal with the first input terminal coupled to the system output terminal for providing a first signal path, voltage divider means coupled to said system output terminal, second cathode follower means coupled between said voltage divider means and the second input terminal of said switching means to provide a second signal path, and a first and a second T-network each having an input terminal coupled to said switching means and an output terminal coupled to a summing point, said first and second T networks having phase characteristics that differ by substantially 180 degrees independent of frequency and having relative amplitude characteristics that vary differently with frequency being equal in amplitude at a definite frequency so as to cancel at said summing point, said switching means being controllable to couple said first and second signal paths respectively through said first and second T networks in a first switch position and respectively through said second and first T networks in a second switch position, said summing point being coupled to said control terminal of said frequency selective amplifier for varying the gain characteristics thereof, whereby said switching means selects a first and a second range of operation and said voltage divider means selects the definite frequency where the signals applied through the T network cancel at said summing point to control said amplifier so as to determine the pass band frequency in the selected range and pass the selected frequency component to said output terminal.

2. A frequency selective rejection circuit responsive to an input signal including a plurality of frequency components to develop a frequency rejection characteristic centered at a selected frequency component comprising switching means having first and second signal input paths with the first signal input path responsive to said input signal, voltage divider means responsive to said input signal and controllable to attenuate said input signal, means coupled to said voltage divider means for varying the attenuation of said input signal, cathode follower means coupled between said voltage divider means and the second signal input path of said switching means, a parallel-T network having first and second parallel transmission paths coupled to said switching means and to a common point, said first and second transmission paths in response to signals applied therethrough having respective low pass and high pass characteristics and having relative phase characteristics differing by 180 degrees substantially independent of the frequency of the signals applied thereto and having relative amplitude characteristics varying differently and being equal in amplitude at a desired rejection frequency, and selector means coupled to said switching means for controlling said switching means to couple said first and second signal input paths respectively to said first and second transmission paths for a first selection condition and respectively to said second and first transmission paths for a second selection condition, said parallel-T networks attenuating the selected frequency component as selected by said voltage divider means and said switching means.

3. A frequency rejection circuit for responding to an input signal including a plurality of signal components at different frequencies to provide an attenuation curve with steep sides and maximum attenuation at the frequency of a selected signal component, said input signal being applied to said frequency rejection circuit from a low output impedance source comprising a voltage divider coupled between said low output impedance source and a source of reference potential, a movable arm contacting said voltage divider, a switch having first and second input terminals and first and second output terminals controllable to couple said first and second input terminals, respectively, to said first and second output terminals in a first selected switching position and to couple said first and second input terminals, respectively, to said second and first output terminals in a second switching position, said first input terminal coupled to said source of input signals, a cathode follower tube coupled between said movable arm and the second input terminal of said switch to provide a low impedance output to signals attenuated by said voltage divider, a summing point, a first T network including a first and a second resistor coupled in series between said first output terminal of said switch and said summing point and a first capacitor coupled from between said first and said second resistors to said source of reference potential, and a second T network including a second and a third capacitor coupled in series between said second output terminal of said switch and said summing point and a third resistor coupled from between said second and third capacitors to said source of reference potential, said switch providing selection of a first and a second range of frequencies and said movable arm providing selection of a desired signal component to be substantially suppressed.

4. A frequency selective filter system responsive to a source of an input signal including a desired signal component at a first frequency and undesired signal components at a plurality of different frequencies for selectively passing said desired signal component to a system output terminal comprising a frequency selective amplifier including first and second tubes having anode to cathode paths coupled in series between first and second terminals of a potential source, the grid of said first tube coupled to said source of said input signal, a first cathode follower tube having a grid coupled to the anode of said first tube and having an anode to cathode path coupled, respectively, between said first and second terminals of said potential source and having a cathode coupled to said system output terminal for providing a low output impedance thereto, a potentiometer resistor coupled between said output terminal and said second terminal of said potential source, a selectively movable tap contacting said potentiometer resistor, a second cathode follower tube having an anode to cathode path coupled between said first and second terminals of said potential source and having a grid coupled to said movable tap, a range selecting switch having first and second input and output terminals with said first input terminal coupled to the system output terminal and said second input terminal coupled to the cathode of said second cathode follower tube for providing low output impedance therefrom, said switch being controllable to a first condition for coupling said first and second input terminals, respectively, to said first and second output terminals, and to a second condition for coupling said first and second input terminals, respectively, to said second and first output terminals, a summing point, a first T network including a first and a second resistor coupled in series between said first output terminal and said summing point and a first capacitor coupled from between said first and second resistors to said second terminal of said potential source, and a second T network including a second and third capacitor coupled in series between said second output terminal and said summing point and a third resistor coupled from between said second and third capacitors to said second terminal of said potential source, said summing point coupled to the grid of the second tube of said amplifier, whereby the desired signal component is selected by said switch and said movable tap to control the gain of said amplifier so that the desired signal component is passed to said output terminal while other signal components are substantially attenuated.

5. A frequency selective filter system comprising frequency selective amplifier means having variable gain characteristics, first low output impedance means coupled between said amplifier means and a system output terminal, variable attenuating means having an input terminal coupled to said system output terminal, second low output impedance means coupled to an output terminal of said variable attenuating means, switching means for switching a first and a second input terminal to respectively contact a first and a second output terminal as to respectively contact a second and a first output terminal, said first input terminal of said switching means coupled to said system output terminal and said second input terminal of said switching means coupled to said second low output impedance means, a summing point coupled to said amplifier means, and frequency determining means including a low pass and a high pass T network respectively coupled between said first and second output terminals of said switching means and said summing point and including resistance and capacitance elements to respectively provide a first and a second transmission path to said summing point, said first and second transmission paths having relative phase characteristics 180 degrees out of phase from each other independent of frequency, each transmission path contributing to the feedback signal at said summing point so that the amplitude of the signal applied through the variable attenuating means controls the frequency at which the gain of the amplifier is substantially increased and the switch position determines the range of frequency selection.

6. A frequency selective filter system comprising a source of an input signal having components at a plurality of frequencies, a frequency selective amplifier having an input terminal coupled to said source of input signals and having an output terminal and a control terminal, cathode follower means coupled between the output terminal of said amplifier and a system output terminal, variable attenuating means coupled to said system output terminal, switching means having first and second input and output terminals with said first input terminal coupled to said system output terminal and said second input terminal coupled to said cathode follower means, said switching means being controllable to couple said first and second input terminal, respectively, to said first and second output terminals in a first condition and, respectively, to said second and first output terminals in a second condition, a summing point coupled to the control terminal of said amplifier, a low pass T network coupled between said first output terminal and said summing point, and a high pass T network coupled between said second output terminal and said summing point, said low and high pass T networks shifting the relative phase of signals applied therethrough 180 degrees relative to each other substantially independent of frequency and varying the amplitude of signals applied therethrough differently with frequency, the amplitude of signals derived from the two T networks being equal at a selected frequency, said switching means and said attenuating means providing selection of a desired component of said input signal to develop a signal at said summing point to control the gain of said amplifier means so that the desired component is passed to said system output terminal.

References Cited in the file of this patent

UNITED STATES PATENTS 2,780,724 Fickett ---------------- Feb. 5, 1957